US00RE35665E

United States Patent [19]

Lin et al.

[11] E Patent Number: Re. 35,665

[45] Reissued Date of Patent: Nov. 18, 1997

[54] SURFACE LIGHT EMITTING DIODE WITH ELECTRICALLY CONDUCTIVE WINDOW LAYER

[75] Inventors: Jyh-Feng Lin, Hua-Lien; Chuan-Ming Chang, Hsinchu; Biing-Jye Lee, Hsinchu; Ming-Jiunn Jou, Hsinchu, all of Taiwan

[73] Assignee: Industrial Technology Research Institute, Taiwan

[21] Appl. No.: 668,601

[22] Filed: Jun. 25, 1996

Related U.S. Patent Documents

Reissue of:

[64] Patent No.: 5,481,122
Issued: Jan. 2, 1996
Appl. No.: 279,874
Filed: Jul. 25, 1994

[51] Int. Cl.[6] ..... H01L 33/00

[52] U.S. Cl. ..... 257/94; 257/96; 257/97; 257/103; 372/49

[58] Field of Search ..... 257/94, 95, 96, 257/97, 98, 103; 372/49

[56] References Cited

U.S. PATENT DOCUMENTS

| | | | |
|---|---|---|---|
| 4,570,172 | 2/1986 | Henry et al. | 257/97 |
| 5,233,204 | 8/1993 | Fletcher et al. | 257/97 X |
| 5,300,791 | 4/1994 | Chen et al. | 257/96 X |
| 5,568,499 | 10/1996 | Lear | 372/45 |

OTHER PUBLICATIONS

Andre et al., "III–V Alloys and Their Potential for Visible Emitter Applications", *Prog. Crystal Growth and Charact.*, vol. 19, 1989, Pergamon Press, Great Britain, pp. 97–105.

*Primary Examiner*—William Mintel
*Attorney, Agent, or Firm*—Michael D. Bednarek; Kilpatrick Stockton LLP

[57] ABSTRACT

A surface emitting AlGaInP LED having an ITO layer as a window layer to eliminate the current crowding effect, and an ohmic contact layer between its double hereto-structure of AlGaInP and the ITO layer, so that ITO can be utilized with the double hereto-structure of AlGaInP.

18 Claims, 7 Drawing Sheets

SURFACE LIGHT EMITTING DIODE WITH ELECTRICALLY CONDUCTIVE WINDOW LAYER

Matter enclosed in heavy brackets [ ] appears in the original patent but forms no part of this reissue specification; matter printed in italics indicates the additions made by reissue.

FIELD OF THE INVENTION

The present invention relates in general to the structure of a light emitting diode (LED), and more particularly, to the structure of a surface emitting LED using an electrically conductive oxide as a transparent window layer.

BACKGROUND OF THE INVENTION

The AlGaInP alloy system has been used for making high quality semiconductor lasers with an emitting wavelength of around 670 nanometer. This alloy system may also be useful for making light emitting diodes (LEDs) for wavelengths ranging from about 560 to 680 nanometers by adjusting the aluminum to gallium ratio in the active region of the device. Increasing the aluminum proportion produces shorter wavelengths. It has also been demonstrated that metalorganic vapor phase epitaxy (MOVPE) provides a means for growing optically efficient AlGaInP heterostructure devices.

There are four types of prior arts of AlGaInP LED pertaining to the present invention. The device geometry of a conventional LED is simple, as shown in FIG. 1, which is disclosed in 'Prog. Crystal Growth and Charact', Vol. 19, 1989, pp. 97–105 by J. P. Andre et al. The LED of FIG. 1 is fabricated with a back electrical contact 110, a substrate of n-type GaAs 120, a double heterostructure of AlGaInP 130, which includes a layer of n-type AlGaInP 131, a layer of undoped AlGaInP 132, and a layer of p-type AlGaInP 133, and a front electrical contact 140. The undoped AlGaInP 132 is technically referred to as an active layer, and the two neighboring n-type AlGaInP layer 131 and p-type AlGaInP layer 133 are referred to as confining layers.

For efficient operation of the LED, current injected by the front electrical contact 140 should be spread evenly in the lateral direction so that the current will cross the p-n junction of the double heterostructure of AlGaInP 130 uniformly to thereby generate light evenly. The p-type AlGaInP layer 133, which is grown by means of the MOVPE process, is very difficult to dope with acceptors of a concentration higher than 1E18 $cm^{-3}$. Moreover, it is a material characteristic that hole mobility is low in p-type AlGaInP semiconductors (which is about 10 to 20 $cm^2$*V/sec). Due to these two factors, the electrical resistivity of the p-type AlGaInP layer 132 is comparatively high (i.e., about 0.5 Ω-cm) so that current spreading is severely restricted. As a result, the current tends to concentrate under the front electrical contact 140. This is often referred to as a current crowding problem.

One technique to solve the current crowding problem is disclosed by Fletcher et al in a U.S. Pat. No. 5,008,718 and in the Journal of Electronic Materials, Vol. 20, No. 12, 1991, pp. 1125–1130. The proposed LED structure is shown in FIG. 2 (in this FIGURE, layers that are not changed in appearance from the structure of FIG. 1 are labelled with the same reference numerals), in which a semiconductor window layer 200 is grown upon the p-type AlGaInP layer 133. The window layer 200 should be selected from materials that have a low electrical resistivity so that current can spread out quickly, and a bandgap higher than that of the AlGaInP layers so that the window layer is transparent to light emitted from the active layer of AlGaInP.

In an LED for generating light in the spectrum from red to orange, an AlGaAs material is selected to form the window layer 200. The AlGaAs material has the advantage of having a lattice constant compatible with that of the underlying GaAs substrate 12. In an LED for generating light in the spectrum from yellow to green, a GaAsP or GaP material is used to form the window layer 200. It is a drawback of using the GaAsP or the GaP material that their lattice constants are not compatible with those of the AlGaInP layers 130 and the GaAs substrate 120. This lattice mismatch causes a high dislocation density that produces less than satisfactory optical performance.

FIG. 3 shows a third prior art LED disclosed in Photonics Spectra, December 1991, pp. 64–66, by H. Kaplan, and in Jpn. J. Appl. Phys. Vol 31 (1992) pp. 2446–2451, by Hideto Sugawara et al. The LED of FIG. 3, in addition to the structure of FIG. 1, is fabricated with a Bragg reflector layer 310, a current-blocking layer 320, and a current spreading layer 330. The current spreading layer 330 has a very low electrical resistivity and the current-blocking layer 320 is arranged at a position where it is in alignment with the front electrical contact 140 and thus is spread out laterally by the current-blocking layer 320. Moreover, the reflector layer 310 can be used to prevent the light emitted by the active layers from being absorbed by the GaAs substrate.

It is a drawback of the LED of FIG. 3 that the fabricating process, in which the MOVPE procedure needs to be performed twice, is very complex.. Moreover, the p-type AlGaInP layer 133 is easily oxidized since it contains a large proportion of aluminum.

To address the drawbacks of the LED shown in FIG. 3, Joji Ishkawa et al. have proposed an indium-tin oxide/InGaAsP/AlGaAs LED structure as shown in FIG. 4. This LED comprises an n-type indium-tin oxide (ITO) window layer 410, an undoped InGaAsP active layer 420, a p-type AlGaAs cladding layer 430, a p-type GaAS substrate 440 and an Au/AuZnNi electrode 450. The ITO window layer 410 provide better current spreading than the AlGaAs window layer under a much lower thickness because it has a lower electrical resistivity. Therefore, current crowding is eliminated and the manufacturing time can be reduced. However, this sort of structure can not be applied to LEDs with n-type GaAs substrates.

SUMMARY OF THE INVENTION

The object of the present invention is to provide a structure of a double hetero-structure surface light-emitting diode that is capable of reducing the current crowding effect.

Another object of the present invention is to provide a structure of a double hetero-structure AlGaInP surface light-emitting diode using indium-tin oxide as a window layer to obtain higher efficiency and to reduce the manufacturing time.

Another object of the present invention is to provide a structure of a double hetero-structure AlGaInP surface light-emitting diode having an indium-tin oxide window layer on an n-type GaAs substrate.

BRIEF DESCRIPTION OF THE DRAWING

The present invention can be more fully understood by reading the subsequent detailed description of the preferred embodiments thereof with references made to the accompanying drawings, wherein.

DETAILED DESCRIPTION OF THE PREFERRED EMBODIMENT

Figure 1:
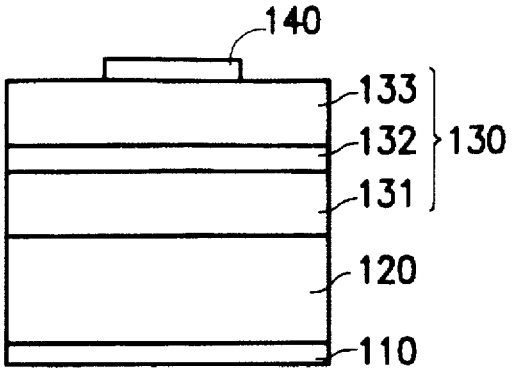
FIG. 1 (PRIOR ART)
FIG. 1 is a sectional illustration of a first prior art LED.
Figure 2:
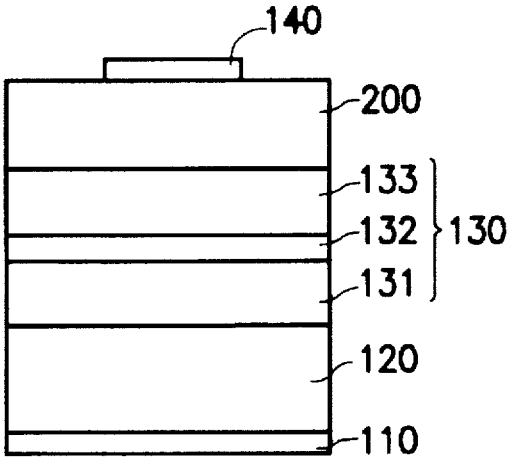
FIG. 2 (PRIOR ART)
FIG. 2 is a sectional illustration of a second prior art LED.
Figure 3:
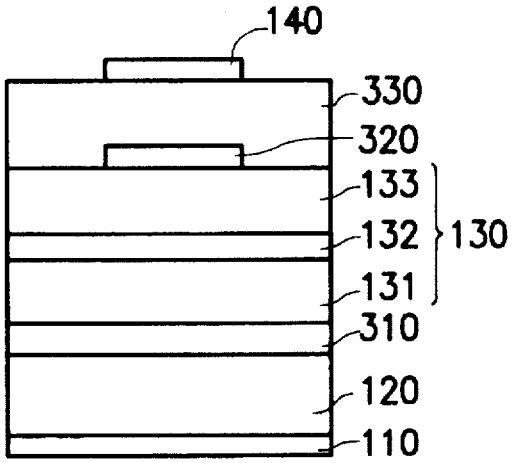
FIG. 3 (PRIOR ART)
FIG. 3 is a sectional illustration of a third prior art LED.
Figure 4:
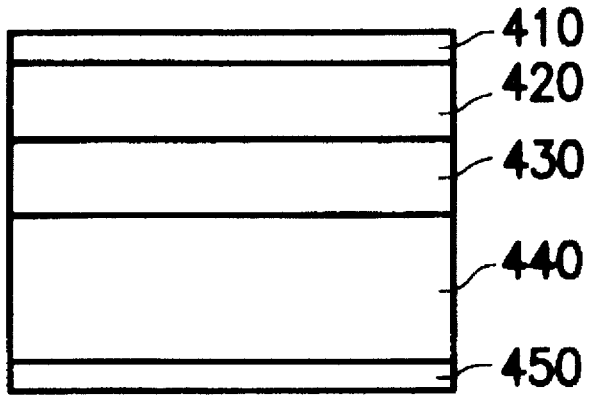
FIG. 4 (PRIOR ART)
FIG. 4 is a sectional illustration of a fourth prior art LED.
Figure 5:
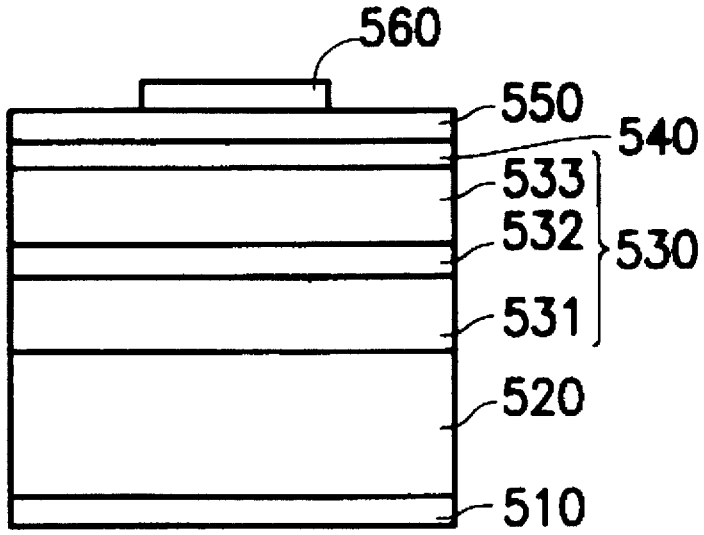
FIG. 5 is a sectional illustration of an LED fabricated in accordance with the present invention.

FIG. 5 is a sectional view illustrating the structure of an exemplary LED constructed in accordance with the present invention. The LED of FIG. 5 includes a back electrical contact 510, a substrate of n-type GaAs 520, a double heterostructure of AlGaInP 530 (generally referred to as active p-n junction layers), a [transparent] ohmic contact layer 540, a transparent ITO window layer 550, and a front electrical contact 560, wherein the transparent window layer 550 is formed by sputtering a layer of electrically conductive film of about 0.1 to several micrometers in thickness. The double heterostructure of AlGaInP 530 includes, as in the LEDs of FIGS. 1–3, a layer of n-type AlGaInP 531, a layer of undoped AlGaInP 532, and a layer of p-type AlGaInP 533.

GaAsP, GaP or GaAs is used to form the ohmic contact layer 540. Its carrier concentration must be greater than $10^{18}$ $cm^{-3}$ and its thickness must be greater than 500 Å at least, so as to form good ohmic contact between the double heterostructure of AlGaInP 530 and the transparent window layer 550.

Figure 6:
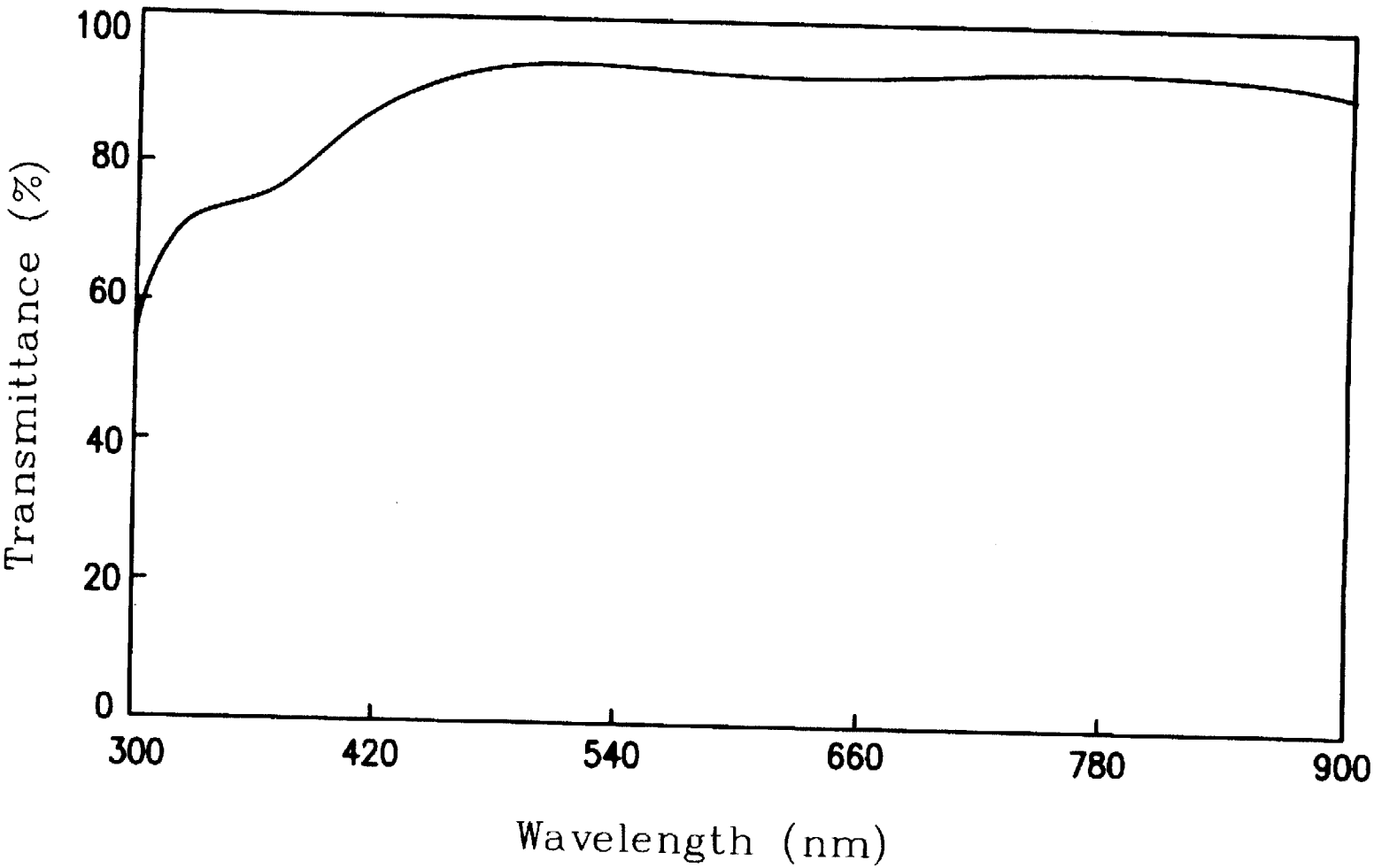
FIG. 6 illustrates the relation of the transmittances of the transparent window layer in the present invention to different wavelengths.

Tin oxide, indium oxide or indium tin oxide is preferred for forming the transparent window layer 550. The preferred thickness of the conductive transparent oxides is between 0.1 micrometer to several micrometers, so that the transmittance is about 90% for light wavelengths in the range from 500 nanometers to 800 nanometers as shown in FIG. 6. Therefore, the transmittance of the window layer is excellent for LEDs in the wavelength range from 555 nanometers (green) to 630 nanometers (red). In addition, the transparent window layer 550 will not absorb photons emitted from the active p-n junction layers. Furthermore, the electrical resistivity of the transparent window layer is only about $3*10^{-4}\Omega$-cm so that the injected current may substantially spread out through the entire diode, thereby contributing to higher power output.

Figure 7:
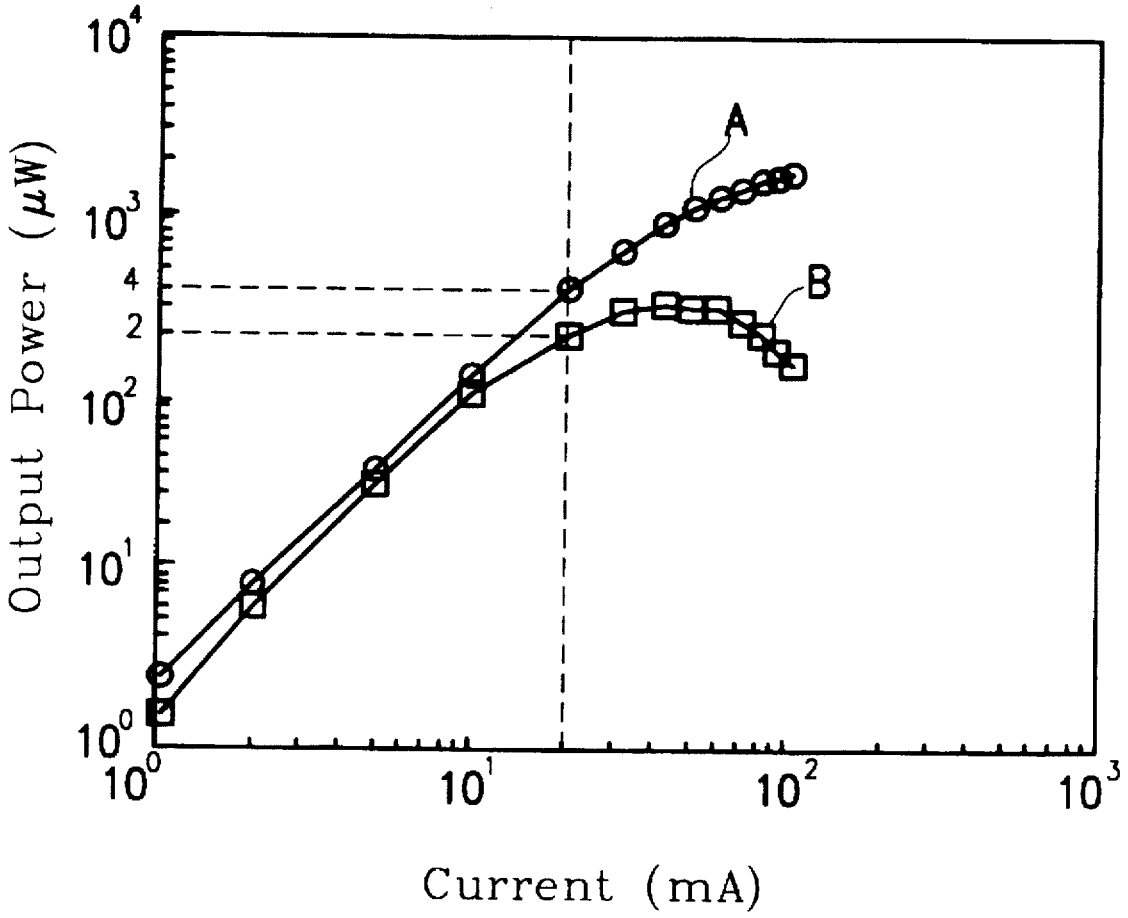
FIG. 7 illustrates a comparison of operating current to output power of the double heterostructure LEDs with a window layer and without a window layer.

FIG. 7 illustrates a comparison of operating current to output power of the double heterostructure LEDs with a conductive transparent window layer (curve A) and without a window layer (curve B). The light-emitting power and the external quantum efficiency are higher in curve A since the injected current spreads uniformly throughout the entire diode.

Figure 8:
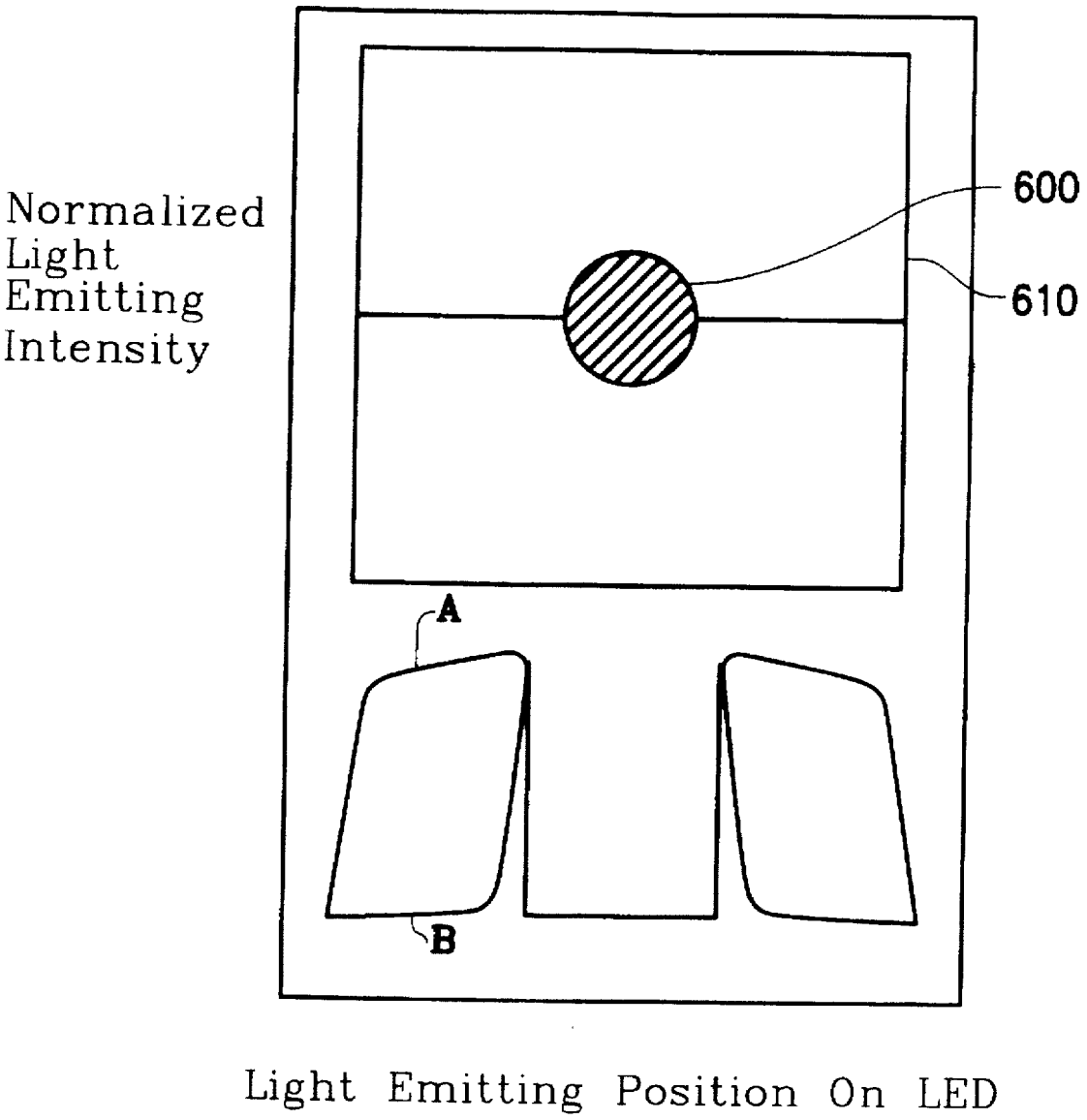
FIG. 8 illustrates the current spreading in a double heterostructure LEDs with a window layer and without a window layer.

FIG. 8 illustrates current spreading in double heterostructure LEDs with a conductive transparent window layer (curve A) and without a window layer (curve B). Most of the light-emitting area of general double heterostructures is near the electrical contact 600, so most of light emitted from the active p-n junction 610 layers will be obstructed by the electrical contact 600. Apparently, forming an additional transparent window layer using electrically conductive oxides can solve the current crowding problem.

Figure 9:
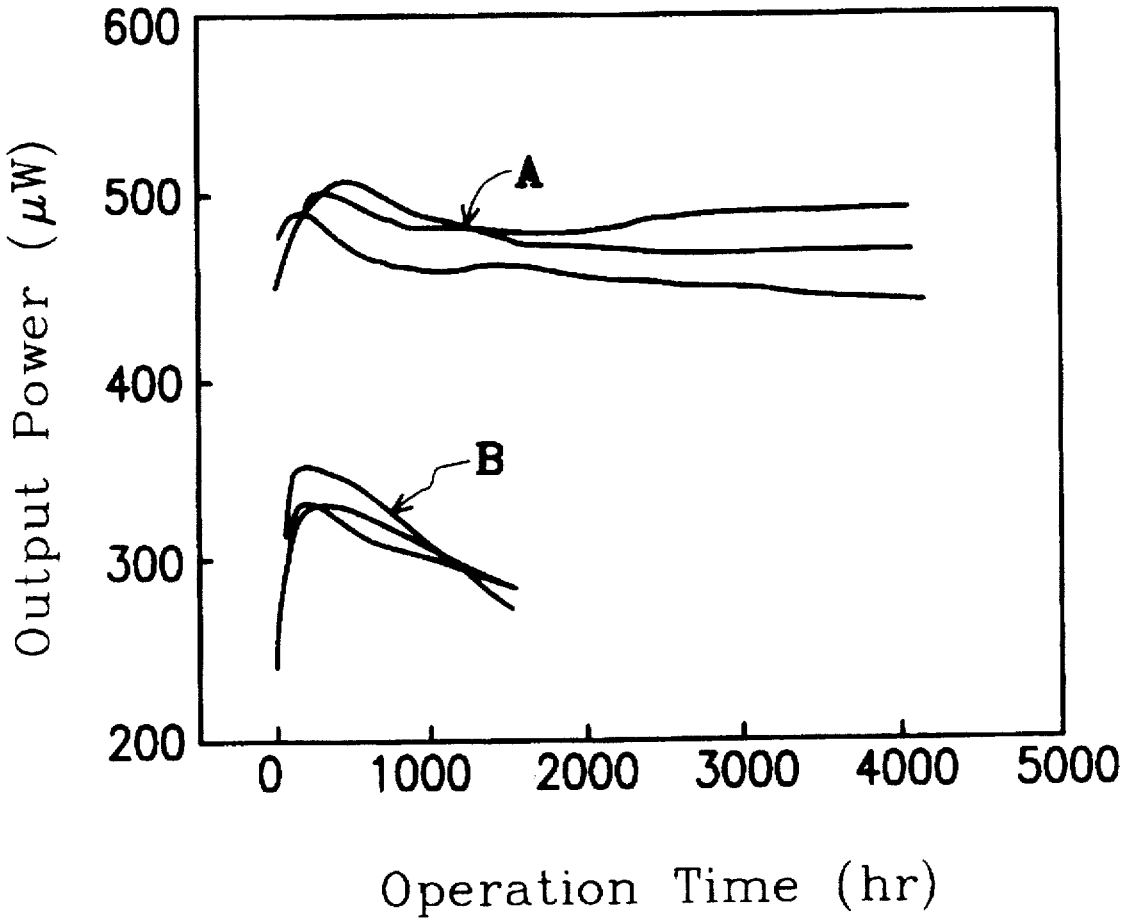
FIG. 9 illustrates the relationship of the operating time and output power of LEDs with a window layer and without a window layer under a 20 mA injected current at room temperature.

FIG. 9 illustrates the relationship of operating time and output power of LEDs with a conductive transparent window layer (curve A) and without a window layer (curve B) for an injected current of 20 mA at room temperature. The LED according the present invention displays higher output power and better reliability (curve A) as shown in FIG. 9. The luminance of the LED in accordance with this invention is close to 2 candela after packaging.

Figure 10:
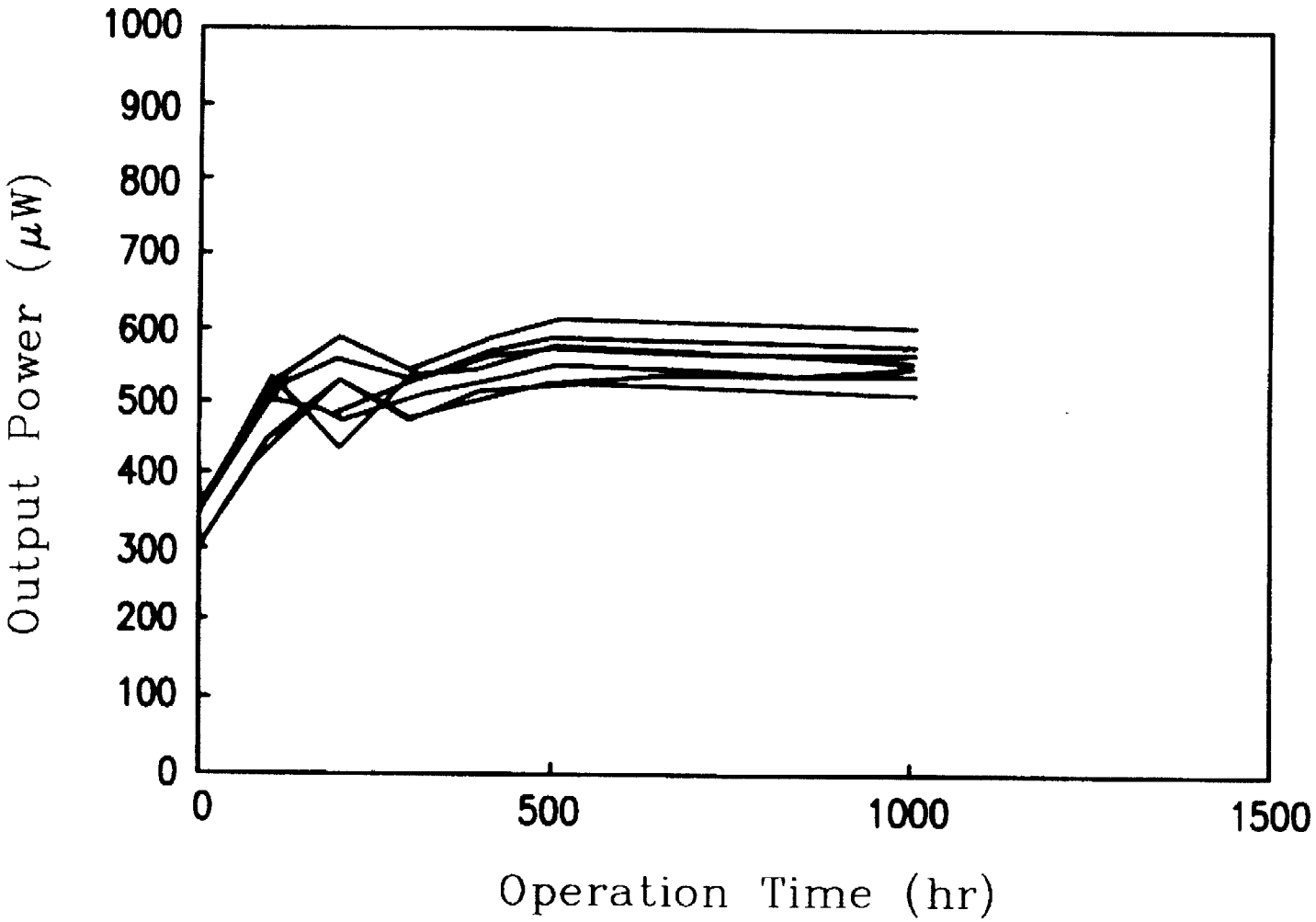
FIG. 10 illustrates the relationship of operating time and output power of LEDs in accordance with this invention with an injected current of 20 mA and an operating temperature of 60° C.

FIG. 10 illustrates the relationship of operating time and output power of LEDs in accordance with this invention for an injected current of 20 mA and an operating temperature of 60° C. The LEDs of the present invention are still stable after a continuous operating period of nearly 1000 hours.

As stated above, since ohmic contact layer 540 is provided, the ITO window layer 550 can be formed on the p-type AlGaInP layer 533. Therefore, the benefits of the ITO window layer, such as low electrical resistivity and a short manufacturing time, are maintained in the n-type GaAs substrate-based LED. The problem of current crowding is also eliminated due to the ITO window layer 550.

The present invention has been described hitherto with exemplary preferred embodiments. However, it is to be understood that the scope of the present invention need not be limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A light emitting diode comprising:

a GaAS substrate of a first conductivity type, which has a back electrical contact;

a double hetero-structure of AlGaInP on the substrate;

[a transparent] *an* ohmic contact layer on the double hetero-structure;

a conductive transparent ITO window layer over the ohmic contact layer; and a front electrical contact on the window layer.

2. The light emitting diode as claimed in claim 1, wherein the window layer comprises tin oxide.

3. The light emitting diode as claimed in claim 1, wherein the window layer comprises indium oxide.

4. The light emitting diode as claimed [an] *in* claim 1, [is] wherein the window layer comprises indium tin oxide.

5. The light emitting diode as claimed in claim 1, wherein the ohmic contact layer comprises GaAsP.

6. The light emitting diode as claimed in claim 1, wherein the ohmic contact layer comprises [GaAsP] *GaP*.

7. The light emitting diode as claimed in claim 1, wherein the ohmic contact layer comprises GaAs.

8. The light emitting diode as claimed in claim 1, wherein the first conductivity type is n-type.

9. The light emitting diode as claimed in claim 1, wherein the first conductivity type is p-type.

10. The light emitting diode as claimed in claim 1, wherein the double hetero-structure comprises an AlGaInP layer of the first conductivity type, an undoped AlGaInP layer, and an AlGaInP layer of a second conductivity type.

11. The light emitting diode as claimed in claim 10, wherein the window layer comprises tin oxide.

12. The light emitting diode as claimed in claim 10, wherein the window layer comprises indium oxide.

13. The light emitting diode as claimed in claim 10, wherein the window layer comprises indium tin oxide.

14. The light emitting diode as claimed in claim 10, wherein the ohmic contact layer comprises GaAsP.

15. The light emitting diode as claimed in claim 10, wherein the ohmic contact layer comprises [GaAsP] *GaP*.

16. The light emitting diode as claimed in claim 10, wherein the ohmic contact layer comprises GaAs.

17. The light emitting diode as claimed in claim 10, wherein the first conductivity type is n-type and the second conductivity type is p-type.

18. The light emitting diode as claimed in claim 10, wherein the first conductivity type is p-type and the second conductivity type is n-type.

* * * * *